United States Patent [19]

Aneshansley

[11] 4,031,530

[45] June 21, 1977

[54] DIGITAL SECOND-ORDER CLOCK LINEARIZER

[75] Inventor: Nicholas E. Aneshansley, Centerville, Ohio

[73] Assignee: Instrulab Incorporated, Dayton, Ohio

[22] Filed: Oct. 22, 1975

[21] Appl. No.: 624,598

[52] U.S. Cl. .................... 340/347 NT; 73/362 AR; 324/99 D; 340/347 AD; 340/347 M

[51] Int. Cl.$^2$ ................. H03K 13/02; H03K 13/20

[58] Field of Search ............ 340/347 NT, 347 AD, 340/347 M; 73/341, 362 AR; 179/15 AV; 235/197, 194; 324/99 D

[56] References Cited

UNITED STATES PATENTS

| | | | |
|---|---|---|---|
| 3,349,390 | 10/1967 | Glassman .................... | 340/347 NT |
| 3,662,163 | 5/1972 | Miller et al. ............ | 340/347 AD X |
| 3,699,318 | 10/1972 | Underkottler et al. ... | 340/347 AD X |
| 3,824,585 | 7/1974 | Meijer ......................... | 340/347 NT |
| 3,939,459 | 2/1976 | Hoopes ....................... | 340/347 NT |

*Primary Examiner*—Thomas J. Sloyan
*Attorney, Agent, or Firm*—Jacox & Meckstroth

[57] ABSTRACT

In order to obtain a very close fit to the characteristic curve of a non-linear sensor, such as a thermocouple, a linearized clock is developed and used to increment a counter during a time period representative of the sensor output. The linearized clock is obtained by passing a precision clock signal through a first synchronous binary rate multiplier which receives rate information from an up/down counter. The up/down counter is incremented or decremented by the output from a second synchronous binary rate multiplier which receives rate information from a programmable read only memory in accordance with the segments of the sensor's characteristic curve through which the time scan may be deemed to be passing.

13 Claims, 1 Drawing Figure

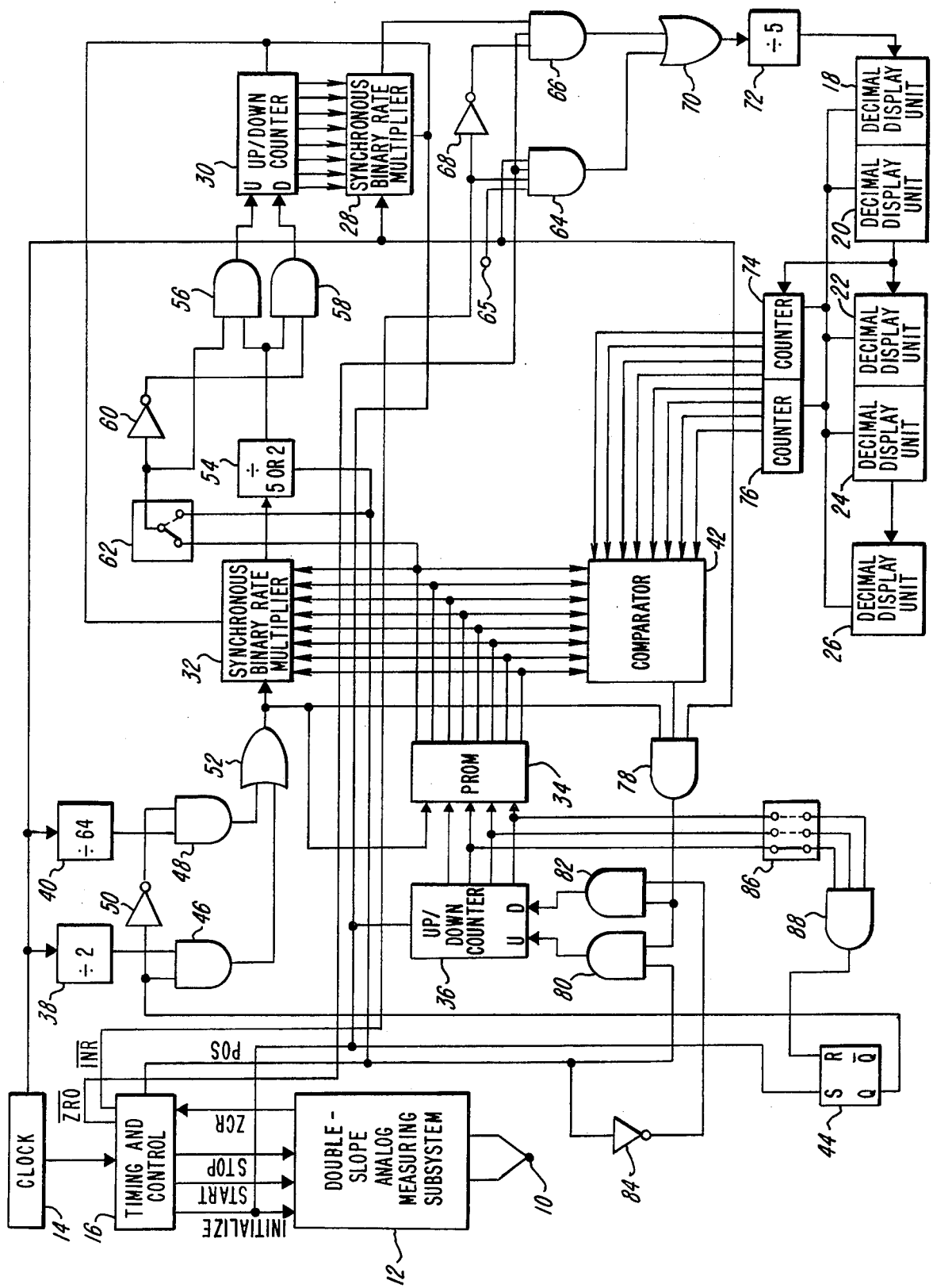

DIGITAL SECOND-ORDER CLOCK LINEARIZER

FIELD OF THE INVENTION

This invention relates to the signal processing arts and, more particularly, to apparatus for linearizing an inherently non-linear signal.

This invention relates still more particularly to linearizer apparatus for processing the voltage output of a thermocouple used in temperature measurement.

BACKGROUND OF THE INVENTION

Many sensors used to monitor physical conditions in process control systems or the like are inherently non-linear such that a correction operation must be carried out before the measured quantity can be displayed or used in calculations. By way of example, thermocouples are very widely used to measure temperature, but thermocouples are notoriously non-linear. Furthermore, different types of thermocouples display different non-linear characteristics. The classical approach to converting a voltage measurement obtained from a thermocouple to a temperature has involved empirically segmenting the characteristic curve of the particular type of thermocouple in order that a different formula may be applied for each segment in which a reading may be obtained. This approach is complex, time consuming, and is not sufficiently accurate for many precision applications since the characteristic curve is simulated by more or less coarse straight line segments.

A precision measurement of the voltage generated by a thermocouple may be obtained utilizing the well-known double-slope analog measuring technique. The amplified signal from the thermocouple is integrated for a predetermined time period from which a voltage representative of the voltage generated by the thermocouple is obtained. Then the double-slope measuring apparatus determines precisely what this voltage is by measuring the time necessary to discharge the holding component to zero when the discharge is carried out at a constant slope. The time period for carrying out the discharge can, of course, be reckoned by counting the number of pulses from a precision clock source during this integrate reference period. However, as previously suggested, the accumulated count obtained will not accurately reflect the measured temperature because of the inherent non-linearity of the thermocouple.

It has been proposed to linearize the clock pulses which are allowed to increment a counter during the integrate reference phase. That is, the clock pulses would be frequency varied in accordance with the slope of the various segments of the sensor's characteristic curve during the integrate reference period. It has further been proposed to carry out this function by passing a constant frequency clock signal through a synchronous binary rate multiplier, the fractional multiplication factor of which is controlled by a plurality of binary input signals methodically applied in accordance with the particular segments of the sensor's characteristic curve through which the measuring apparatus is passed. In effect, the characteristic curve is separated into straight line segments without the necessity for actually calculating according to different formulas for each segment. Thus, this approach also does not give sufficient accuracy for many applications.

OBJECTS OF THE INVENTION

Those skilled in the art will appreciate that it would by highly desirable to provide means by which the necessity for carrying out computations based upon individual formulas for the various segments of a non-linear sensor's characteristic curve could be obviated in conjunction with achieving true curve fitting rather than approximation by straight line segments.

It is therefore a broad object of this invention to provide improved means for obtaining accurate information from a non-linear sensor.

It is another object of this invention to provide such means which achieves a high degree of accuracy.

It is a further object of this invention to provide such means by which a very close match to the characteristic curve of a non-linear sensor may be obtained.

In a more specific aspect, it is an object of this invention to linearize a clock signal by which an accumulated count becomes representative of an actual value of a physical quantity represented by a voltage generated by a non-linear sensor.

SUMMARY OF THE INVENTION

Briefly, these and other objects of the invention are achieved by using a multiple stage counter to control the fractional rate multiplication of a synchronous binary rate multiplier through which a precision clock signal is passed. The counter, in turn, is incremented or decremented according to a lower frequency secondary clock signal processed through a second synchronous binary rate multiplier. The fractional multiplication factor applied by the second binary rate multiplier is methodically altered in accordance with the instantaneous position along the sensor characteristic curve as represented by a group of binary signals which may be obtained, by way of example, from a memory. Thus, the output clock signal from the first binary rate multiplier will be linearized according to the second order of the segment-by-segment information presented to the second binary rate multiplier.

The subject matter of the invention is particularly pointed out in the specification.

The invention, however, both as to organization and method of operation, may best be understood by reference to the following description taken in conjunction with the subjoined claims and the accompanying drawing of which the single FIGURE is a logic block diagram of a presently preferred embodiment of the invention.

DETAILED DESCRIPTION OF THE PREFERRED EMBODIMENT

In the exemplary embodiment, a thermocouple 10 is shown as a sensor which produces a non-linear millivolt level signal, in accordance with its junction temperature. The signal is transmitted to a double-slope analog measuring subsystem 12. Precision timing pulses from a clock circuit 14, which may be a crystal-controlled multivibrator, are applied to a timing and control block 16 which systematically issues the signals necessary to initialize and obtain a reading from the double-slope analog measuring subsystem. More specifically, an initialize signal is applied to the double-slope analog measuring subsystem for the purpose of allowing the amplifier contained therein to stabilize and obtain a reference zero. This initialize period may be on the order of 100 milliseconds, after which a start signal is issued to the double-slope analog measuring subsystem. In response, the double slope analog measuring subsystem integrates the amplified voltage from the thermocouple 10 for a predetermined period of time which terminates when the stop signal is issued by the timing and control block 16. In the exemplary apparatus, this integrate signal period is 100 milliseconds, and, at the end of this period, the voltage through which the internal charging circuit has charged is representative of the voltage generated by the thermocouple 10 which, of course, is a function of its junction temperature. As soon as the stop signal is issued, the charging circuit within the double-slope analog measuring subsystem 12 begins and continues to discharge until a reference zero level is reached. At that instant, a ZCR zero crossing signal is reflected back from the double-slope analog measuring subsystem 12 to the timing and control block. During the controlled slope discharge or integrate reference phase, the ZCR signal will have assumed one or the other of the binary states to indicate whether the measured quantity is positive or negative with respect to a predetermined reference, such as zero degrees. This information is available to the apparatus to be subsequently described as the POS signal which is either a binary one or a binary zero in accordance with the polarity of the signal held in the charging circuit. Zero crossing, therefore, is reflected as a change in state, which may be in either direction, of the ZCR signal. This change in state is sensed by the timing and control block 16 which issues the $\overline{ZRO}$ signal which becomes false or a binary 0 after sensing the transition of the ZCR sigal from the doubleslope analog measuring subsystem 12. The $\overline{INR}$ signal is true except during the integrate reference period; i. e., a binary 0 only between the occurrence of the stop and ZCR signals.

The foregoing functional description of the double-slope analog measuring subsystem 12 and the timing and control block 16 is deemed adequate for the description of the invention which follows.

The exemplary apparatus shown reads into the five digit decimal display, comprising display units 18, 20, 22, 24, 26, a numerical representation of the temperature measured by the thermocouple 10 as represented by the time lapse between the issuance of the stop signal and the ZCR signal response. Because of the previously mentioned non-linearity of the characteristic curve for a thermocouple, equally spaced pulses of the clock 14 cannot simply be gated into the counter of the lowest order decimal display unit 18. Rather, it is necessary to obtain a linearized clock signal such that the number of pulses delivered to the decimal display unit 18 is varied in accordance with the non-linearity of the characteristic curve of the thermocouple 10.

It may be noted that the decimal display units 18, 20, 22, 24, and 26 have the capability for holding the immediately previous count as the cascaded counters are accumulating a new count to be displayed at the end of a measuring period. In the embodiment of the invention herein described, a type SN74143 4-bit counter/latch, 7-segment LED/lamp driver manufactured by Texas Instruments, Incorporated is employed. Inasmuch as the counters in the display units do not provide certain necessary count information, it is desirable to duplicate the instantaneous count held in the decimal display units 22 and 24. This is achieved by applying the carry count from the decimal display unit 20 to the counter 74 which is cascaded with the higher order counter 76. Thus, it will be understood that the counter stage 76 carries the same instantaneous count as the internal counter within the decimal display unit 24. Similarly, the counter 74 carries a count corresponding to that within the internal counter of decimal display unit 22.

The following description pertains to apparatus which comprises an exemplary embodiment of the invention. The precision clock signal from the clock 14 is applied to frequency dividers 38 and 40 and also to the clock input of a first synchronous binary rate multiplier 28. According to the combination of the various binary rate inputs applied to the synchronous binary rate multiplier 28 from an up/down counter 30, the output frequency from the synchronous binary rate multiplier is a corresponding fractional multiple of the frequency of the input signal. In the exemplary embodiment chosen for this description, the synchronous binary rate multiplier 28 is a type SN7497, produced by Texas Instruments, Incorporated. The up/down counter 30 is a type SN74193, also produced by Texas Instruments, Incorporated.

The output from frequency divider 40, which has a relatively high division ratio such as 64, is applied to one input of an AND-gate 48. Similarly, the output from the frequency divider 38, which may have a relatively low division ratio such as 2, is applied to one input of an AND-gate 46. AND-gates 46 and 48 are mutually exclusively enabled according to the logic level appearing at the input to an inverter 50. The output signals from each of the AND-gates 46 and 48 are applied to an OR-gate 52 whereby either a relatively low submultiple of the clock frequency or a relatively high submultiple of the clock frequency will appear at the output of the OR-gate 52 which drives the clock input to a second synchronous binary rate multiplier 32. Thus, the synchronous binary rate multiplier 32 is driven at either about one-half or about 1/64 the rate at which the synchronous binary rate multiplier 28 is driven. The synchronous binary rate multiplier 32 is also a type SN7497.

The output signal issuing from the synchronous binary rate multiplier 32 has a frequency which is a fractional multiple of its input frequency in accordance with the instantaneous binary configuration of the signals appearing on its rate inputs. The output signal from the synchronous binary rate multiplier 32 passes through a frequency divider 54, which may divide by a ratio of either 5 or 2 in accordance with conditions to be described below, and, as a result, a submultiple is applied individual inputs of a pair of AND-gates 56 and 58. The AND-gates 56 and 58 are mutally exclusively enabled in accordance with the logic level observed at the input of an inverter 60. The ANDgate 56 drives the up-count input terminal of up/down counter 30, and the AND-gate 58 drives the down-count terminal thereof. Thus, it will be understood that the signal received from the frequency divider 54 will serve to either increment or decrement the up/down counter 30 in accordance with the logic level input to the inverter 60.

The output from synchronous binary rate multiplier 28 is applied to one input of AND-gate 66. Similarly, another AND-gate 64 has one input coupled directly to the clock signal, and the AND-gates 64 and 66 are mutually exclusively partially enabled by an inverter 68 disposed between second respective inputs to the AND-gates. The inverter 68 is driven by the $\overline{INR}$ signal obtained from the timing and control block 16. In addition, each of the AND-gates 64 and 66 has an input coupled to the $\overline{ZRO}$ signal from the timing and control block 16 and the AND-gate 64 has an additional input 65, discussed below. The respective outputs from the AND-gates 64 and 66 are coupled to separate inputs of an OR-gate 70 such that either the precision clock signal from the clock 14 or the output from the synchronous binary rate multiplier 28, which may be designated the linearized clock signal, appears at the output from the OR-gate 70 provided the $\overline{ZRO}$ signal is true. The signal observed at the output of the OR-gate 70 is passed through a frequency divider 72, which carries out a frequency division of 5, and the resultant signal is utilized to increment the lowest order decimal display unit 18. As previously noted, the decimal display units 18, 20, 22, 24, and 26 are cascaded and the counter stages 74 and 76 are connected to reflect the instantaneous count of the internal counters within the decimal display units 22 and 24.

The binary coded outputs from the counters 74 and 76 are applied to a first series of binary inputs to a comparator 42. A second series of binary inputs to the comparator 42 is received from a programmable read only memory 34, and these same signals are applied to the rate inputs of the synchronous binary rate multiplier 32. The comparator 42 is internal logically configured to issue an output only when the first and second series of inputs are identical bit-by-bit. This logical function readily can be accomplished by a variety of configurations. For example, each of a bank of exclusive OR-gates may receive one input from each of the two series of inputs, with the outputs of all the exclusive OR-gates being coupled to an AND-gate.

The output from the comparator 42, which may be designated the compare signal, is applied as one input to an AND-gate 78 which also receives separate inputs from the OR-gate 52 and the precision clock signal from the clock 14. The output from the AND-gate 78 drive single inputs to each of a pair of AND-gates 80 and 82 which are mutually exclusively enabled in accordance with the logic level of the input to an inverter 84. Inverter 84 is driven by the POS signal from the timing and control block 16 which, as previously noted, has its state determined in accordance with the polarity of the integrated signal within the double-slope analog measuring subsystem 12.

AND-gates 80 and 82 drive, respectively, the count-up and the count-down inputs to an up/down counter 36, also a type SN74193. Thus, depending upon the state of the POS signal, a signal issued from the AND-gate 78 will either increment or decrement the up/down counter 36. The outputs from up/down counter 36 are applied to the four lowest order address inputs to the programmable read only memory 34. The highest order address bit of the programmable read only memory is obtained at the output of the OR-gate 52. In the exemplary embodiment, the three lowest order address bits are also available at a jumper box 86, such that one or more can be jumpered to separate inputs to an AND-gate 88. Any unconnected inputs to the AND-gate 88 may be deemed enabled (which is characteristic of the logic family employed) such that the AND-gate 88 will become fully enabled when the up/down counter 36 reaches a count determined by the jumper box 86. With the jumper box 86 configured as shown, the AND-gate 88 will be fully enabled when the up-down counter 36 reaches a count of four. The output from the AND-gate 88 is used to reset a flip-flop 44 which has its Q output connected to the input of the inverter 50. Thus, it will be understood that the selection between the frequency dividers 38 and 40 is determined in accordance with the state of the flip-flop 44.

A jumper box 62 is used to select the signal which drives the inverter 60 and thus determines whether up/down counter 30 will be incremented or decremented. As shown, the jumper box 62 is hard-wired to receive this sign information from the programmable read only memory 34. The alternative signal is a direct polarity indication from the POS output from the timing and control block 16. The POS signal also determines whether the frequency divider 54 divides by 5 or by 2.

The programmable read only memory 34 constitutes two separate memory sections in one package, one memory section containing segment boundary information and the other memory section containing rate information for individual characteristic curve segments. A programmable read only memory which may be employed is a type SN74188A 256 bit device, manufactured by Texas Instruments, Incorporated. The rate information for the individual segments, which may include a signal factor, is predetermined in accordance with the specific type of sensor, such as a specific type of thermocouple 10, to be utilized in the system. Similarly, the break point or boundary information is predetermined to obtain the best curve fit for a specific type of sensor. Further, as is explained more fully below, the jumper boxes 62 and 86 are also configured to obtain the best performance from a given type of sensor in a given application.

The initialize signal from the timing and control block 16 is utilized to clear both synchronous binary rate multipliers 32, 28 both of the up-down counters 30, 36, the decimal display units 18, 20, 22, 24, and 26, and the counters 74 and 76. In addition, the initialize signal sets the flip-flop 44.

After initialization and before the occurrence of the stop signal which marks the beginning of the integrate reference period, the counters in the decimal display units 18–26 and the counters 74 and 76 are all cleared. The linearized clock output from the synchronous binary rate multiplier 28 is not permitted to increment the lowest order decimal display unit 18 because the AND-gate 66 is disabled by the $\overline{INR}$ signal inverted through the inverter 68. Under certain conditions, the AND-gate 64 will be enabled during this period if its fourth input 65 is enabled.

When the signal $\overline{INR}$ becomes false at the beginning of the integrate reference period, the various counters begin to count from zero. Since the flip-flop 44 was initially set, the AND-gate 46 is enabled each time frequency divider 38 issues an output pulse; i.e., every other pulse issued from the clock 14. The first pulse from the clock 14 will have been applied to and accumulated within the synchronous binary rate multiplier 28. The second pulse will also be applied to the synchronous binary rate multiplier 28 but will also cause an output pulse from the frequency divider 38 to fully enable the AND-gate 46 which drives the OR-gate 52. The OR-gate 52 therefore issues a pulse to the synchronous binary rate multiplier 32 that will be accumulated in accordance with the binary information applied to its rate input from the programmable read only memory 34. That information will be contained in word 00000 of the programmable read only memory. That is, the up/down counter 36 will have been applying all zeros to the four lowest order address bits and the highest order address bit will have been a zero until the OR-gate 52 is first enabled. However, the enablement of the OR-gate 52 changes the highest order address bit to the programmable read only memory 34 to a 1 such that the first word in the second section of the memory, 10000, is addressed and read out. This newly read out information appearing at the output of the programmable read only memory 34 is break point information which the comparator 42 compares with the instantaneous count held in the counters 74 and 76, to determine if it is necessary to change the information applied to the rate input of the synchronous binary rate multiplier 32. If not, the compare signal from the comparator 42 applied to the AND-gate 78 will be false which will prevent a change in the count held in the up/down counter 36 by maintaining the AND-gates 80 and 82 in the disabled state. It may be noted that, so long as the flip-flop 44 remains set, this check will be made every other clock pulse.

In the meantime, as the OR-gate 52 is repetitively enabled, the output from the synchronous binary rate multiplier 32, a fractional product of the input frequency, is applied to the frequency divider 54 which drives single inputs to each of the AND-gates 56 and 58. If the logic level to the inverter 60 is true, the AND-gate 56 will be successively enabled by each output from the frequency divider 54 to increment the up/down counter 30. If the logic level observed at the output to the inverter 60 is false, each output pulse from the frequency divider 54 will fully enable the AND-gate 58 to decrement the counter 30. As previously noted, whether the up/down counter 30 will be incremented or decremented is determined by either the sign information stored in the programmable read only memory 34 or a sign indication received from the timing and control block 16. The determination as to whether the up/down counter 30 should be incremented or decremented depends strictly on what is necessary at a given instant to provide the best curve fit to the characteristic curve of the specific type of sensor, such as the thermocouple 10.

As the up/down counter 30 is incremented or decremented, the fractional multiplication factor applied to the clock signal by the synchronous binary rate multiplier 28 to obtain the linearized clock is correspondingly adjusted.

As the comparator 42 is interrogated each time the OR-gate 52 is enabled, a count held in the counters 74 and 76 will eventually be obtained which matches the break point information applied to the comparator 42. At that time, the compare signal, in conjunction with the signal from the OR-gate 52 and the clock signal, will fully enable the AND-gate 78, and either the AND-gate 80 or the AND-gate 82 will become fully enabled to either increment or decement the up/down counter 36. Whether the up/down counter 36 is incremented or decremented depends upon the state of the POS signal which is applied directly to one input of the AND-gate 80 and is inverted through an inverter 84, the output of which is applied to a corresponding input to the AND-gate 82. If the POS signal is true, the up/down counter 36 will be incremented to change the address applied to the four lower order address bits of the programmable read only memory 34. Thus, information applied to the rate inputs of the synchronous binary rate multiplier 32 will be altered, and different break point information will be applied to the comparator 42 the next time the OR-gate 52 is enabled to read out the information stored in the second word of the alternate section of programmable read only memory 34.

The change in the fractional multiplication factor applied to the pulses received from the OR-gate 52 brings about a corresponding change in the rate at which the up/down counter 30 is either incremented or decremented. Thus, it will be understood that a second offer effect is obtained on the fractional multiplication factor applied to the clock as it passes through the synchronous binary rate multiplier 28 to become the linearized clock which passes through the AND-gate 66, the OR-gate 70, and the frequency divider 72 to increment the lowest order decimal display unit 18.

Restated, each time the OR-gate 52 is enabled, it applies a logic 1 level to the highest order address bit of the programmable read only memory 34. In response, the programmable read only memory issues boundary information stored in its second section. The comparator 42 observes this information and compares it with the count held in the counters 74 and 76. If a full compare does not exist, no change is made to the rate information applied to the synchronous binary rate multiplier 32. However, a full compare between the boundary information from the programmable read only memory and the count held in the counters 74 and 76 will cause a compare signal from the comparator 42 to the AND-gate 78 which will come fully enabled by the output from the OR-gate 52 and the clock signal. The output from the AND-gate 78 is applied to one input each of the AND-gates 80 and 82. If the POS signal is true, the AND-gate 80 will therefore become fully enabled to increment the up/down counter 36. If, on the other hand, the POS signal is false, it will be inverted through the inverter 84 to permit the AND-gate 82 to become fully enabled thereby causing the up/down counter 36 to be decremented. By this means, the up/down counter 36 changes the address issued to the programmable read only memory 34 which changes both the rate information supplied to the synchronous binary rate multiplier 32 and the boundary information supplied to the comparator 42. Thus, the fractional rate multiplication carried out through the synchronous binary rate multiplier 28 is reflected as a change in the rate at which the up/down counter 30 is either incremented or decremented. This produces a corresponding second order effect on the rate information applied to the synchronous binary rate multiplier 28 to effect a different rate of change of the fractional multiplication factor applied to the clock as it is converted to the linearized clock.

With the jumper block 86 wired as shown, it will be noted that, when the up-down counter 36 issues an address portion to the programmable read only memory 34 of 0100, the AND-gate 88 will become fully enabled to reset the flip-flop 44. As the Q output from the flip-flp 44 assumes the false state, the AND-gate 46 is disabled. The logic 0 signal from the Q output of the flip-flop 44 is inverted to a logic 1 through inverter 50 and applied as a partially enabling input to the AND-gate 48. The AND-gate 48 is driven from the output of frequency divider 40 which issues a single pulse for every 64 pulses received from the clock 14. Thus, the AND-gate 48 is fully enabled every 64 clock pulses to enable the OR-gate 52. When the OR-gate 52 is enabled, the same events previously described take place; i.e., a comparison is made to determine whether a boundary has been reached according to the boundary information stored in the programmable read only memory 34 and the count held in the counters 74 and 76. If so, the up/down counter 36 is either incremented or decremented whereby the programmable read only memory 34 issues new rate information to the synchronous binary rate multiplier 32 and also issues new boundary information to the comparator 42 the next time the OR-gate 52 becomes enabled. The up/down counter 30 is thus still incremented or decremented, but at a very much slower rate than previously.

The reason for the much more frequent enablement of the OR-gate 52 initially (which may not be necessary for some sensors) is simply to break the characteristic curve of the particular sensor into more segments in the area in which the curve is most rapidly changing. It will be understood that the division by 2 carried out by the frequency divider 38 and the division by 64 carried out by the frequency divider 40, as well as the quantity wired into the jumper box 86, may be altered to best serve the needs of a particular sensor. As suggested above, the type of sensor employed and the accuracy desired determines the frequency with which a test should be made as to whether or not a change in the count held in the up/down counter 36, and hence, the addressed words in the programmable read only memory 34, may be necessary. For many sensor types and applications, only the higher division ratio, such as that provided by the frequency divider 40, need be retained, since the characteristic curves of commonly utilized sensors do not change abruptly over the greater part of their extent.

When the ZCR signal is issued by the double slope analog measuring subsystem 12, indicating that it has completed the integrate reference task, the $\overline{ZRO}$ signal from the timing and control block 16 goes false to disable the AND-gate 64 and 66 and thereby inhibit further accumulation of counts in the decimal display units 18–26. When the various components in the apparatus are initialized, the linearized count just obtained is clocked into the display portion of the decimal display units 18–26, and a subsequent measurement is taken. In the exemplary apparatus illustrated, the display is thus updated every one-half second.

Those skilled in the art will appreciate that the linearized count obtained could as readily be transferred into other utilization apparatus, such as a process computer, wherein the necessity for calculating the units measured by the sensor is unnecessary, in that the information can be used directly to effect a considerable savings in time, while obtaining a higher degree of accuracy than is usually achieved. In effect, a precise analog-to-digital conversation is carried out, and the resultant digital information is available for such utilization as may be desirable in a given environment. In addition, it will be apparent that a scanner and appropriate control apparatus may be employed to handle a plurality of sensors. Varied types of sensors may be handled by providing means, such as a random access memory, for revising the boundary and rate information applied to the rate multiplier 32 and the comparator 42.

Further, it will be apparent that the cascading of synchronous binary rate multipliers need not be limited to two stages and a consequent second order effect. Indeed, three or more stages may be employed, with or without additional memories, to obtain higher order effects such as might be necessary to achieve a close fit to a particularly tortuous characteristic curve.

Although the preferred embodiment of the apparatus and process has been described, it will be understood that within the purview of this invention various changes may be made in the form, proportions, elements, and the combination thereof, which generally stated consist in a method or apparatus capable of carrying out the objects set forth, as disclosed and defined in the appended claims.

The invention having thus been described, the following is claimed:

1. A linearizer for processing a non-linear signal comprising:
    A. a first source of timing pulses;
    B. a first synchronous binary rate multiplier, said first binary rate multiplier having a signal input terminal, a signal output terminal, and a plurality of rate control input terminals;
    C. means coupling timing pulses from said first source to said signal input terminal of said first synchronous binary rate multiplier;
    D. a second source of timing pulses, the pulses from said second source occurring at a lower frequency than the pulses from said first source;
    E. a second synchronous binary rate multiplier, said second binary rate multiplier having a signal input terminal, a signal output terminal, and a plurality of rate control input terminals;
    F. means coupling timing pulses from said second source to said signal input terminal of said second synchronous binary rate multiplier;
    G. a first counter, said first counter having an increment input terminal and a plurality of output terminals which issue output signals representative of the instantaneous count held therein;
    H. means coupling said signal output terminal of said second synchronous binary rate multiplier to said increment input terminal;
    I. means individually coupling said output terminals from said first counter to said rate control input terminals of said first binary rate multiplier;
    J. means for developing a binary representation of the second order of the correction factor instantaneously required to effect linearization of the non-linear signal; and
    K. means coupling the binary representation to said control input terminals of said second binary rate multiplier whereby the binary representation of the second order of the correction factor controls the fractional multiplication which said second binary rate multiplier applies to the timing pulses from said second source, and the resultant pulses applied to said increment input to said first counter alter the count therein, thereby correspondingly altering the rate multiplication applied to the timing pulses from said first source by said first binary rate multiplier, the linearized pulses issuing from said output terminal of said first binary rate multiplier therefore being linearized in accordance with the instantaneously desired correction factor.

2. The linearizer of claim 1 in which said means for developing the binary representation comprises;
    A. a memory for storing a plurality of addressable words, each word being a predetermined binary representation of the second order of a correction factor for a predetermined segment of the signal to be linearized; and
    B. addressing means coupled to said memory for successively addressing words stored therein in accordance with corresponding changes in the segments of the signal to be linearized.

3. The linearizer of claim 2 in which said addressing means includes a second counter having an increment input terminal and plurality of output terminals which issue output signals representative of the instantaneous count held therein, which output signals comprise at least a portion of the address signals coupled to said memory, and boundary sensing means responsive to a need for a change in the segment of the signal to be linearized for issuing a pulse to said increment input terminal of said second counter.

4. The linearizer of claim 1 in which said first counter is an up/down counter having both increment and decrement inputs and said binary representation includes a sign component, said linearizer further including means responsive to the sign component of said binary representation for selectively steering the pulses issuing from said second binary rate multiplier to one of said increment and decrement inputs to said first counter.

5. In a linearizer in accordance with claim 3 in which the signal to be linearized includes an indication of polarity and said second counter is an up/down counter having both increment and decrement inputs, said linearizer further including means responsive to the sign indication for selectively steering pulses from said boundary sensing means to one of said increment and decrement inputs to said second counter.

6. The linearizer of claim 5 in which said first counter is an up/down counter having both increment and decrement inputs and said binary representation includes a sign component, said linearizer further including selection means for selecting between the sign component and the sign indication; and means responsive to the selected one of the sign component and sign indication for selectively steering the pulses issuing from said second rate multiplier to one of said increment and decrement inputs to said first counter.

7. The linearizer of claim 5 which further includes:
A. a multiple stage counter/display unit having an increment input;
B. means coupling said linearized pulses to said increment input of said counter/display unit;
C. a comparator, said comparator having first and second series of binary inputs and an output terminal which issues a compare signal only when the signals applied to said first and second series of binary inputs are identical, digit by digit;
D. means for accessing the instantaneous count of at least one stage of said counter/display unit;
E. means coupling the accessed count to said first series of binary inputs;
F. means coupling the addressed word from said memory to said second series of binary inputs; and
G. means coupling said output from said comparator to said selection means for selective enablement thereof;
said comparator, said memory, and said accessing means comprising said boundary sensing means.

8. The linearizer of claim 7 in which pulses from said second source are coupled to the highest order address input to said memory and to an enabling input to said means coupling said output from said comparator to said selection means.

9. The linearizer of claim 3 which further includes means responsive to a predetermined number of the addresses issued by said second counter for changing the frequency of pulses from said second source, the changed frequency being lower than the frequency of the pulses from said first source.

10. A linearizer for processing a non-linear signal comprising:
A. a first synchronous binary rate multiplier, said first binary rate multiplier having a signal input terminal, a signal output terminal, and a plurality of rate control input terminals;
B. a second synchronous binary rate multiplier, said second binary rate multiplier having a signal input terminal, a signal output terminal, and a plurality of rate control input terminals;
C. a first up/down counter, said first up/down counter having an increment input terminal, a decrement input terminal, and a plurality of output terminals which issue output signals representative of the instantaneous count held therein;
D. a second up/down counter, said second up/down counter having an increment input terminal, a decrement input terminal, and a plurality of output terminals which issue output signals representative of the instantaneous count held therein;
E. a first source of precision timing pulses;
F. a second source of precision timing pulses, the pulses from said second source occurring at a lower frequency than the pulses from said first source;
G. a multiple stage decimal counter/display unit having an increment input;
H. a multiple stage decimal repeater counter adapted to repeat the count instantaneously contained within at least two stages of said multiple stage decimal counter/display unit;
I. a memory for storing a plurality of addressable words in each of first and second word groups, each word in said first group being a binary representation of the second order of a correction factor for a predetermined segment of the characteristic curve of the thermocouple, each word in said second group being a binary representation of curve segment boundary information, said memory including a plurality of address inputs;
J. a comparator, said comparator having first and second series of binary inputs and an output terminal which issues a compare signal only when the signals applied to said first and second series of binary inputs are identical, digit by digit;
K. first coupling means coupling the precision timing pulses from said first source to said signal input terminal of said first synchronous binary rate multiplier;
L. second coupling means for coupling said signal output terminal of said first synchronous binary rate multiplier to said increment input of said digital counter/display unit;
M. third coupling means for coupling said output terminals of said first up/down counter to said rate control input terminals of said first synchronous binary rate multiplier;
N. fourth coupling means for coupling the timing pulses from said second source to said input terminal of said second synchronous binary rate multiplier;
O. fifth coupling means for selectively coupling said signal output terminal of said second synchronous binary rate multiplier to said increment and decrement inputs to said first up/down counter, said third coupling means being responsive to a predetermined one of a sign component of the correction factor binary representation and a sign indication of the quantity being linearized during the integrate reference time period for selectively steering the pulses issuing from said signal output terminal of said second binary rate multiplier to one of said increment and decrement inputs of said first up/down counter;

P. sixth coupling means for coupling the instantaneous count held in said repeater counter to said first series of binary inputs to said comparator;

Q. seventh coupling means for coupling the boundary information words from said memory to said second series of binary inputs to said comparator;

R. eighth coupling means for coupling said compare output from said comparator to said second up/down counter, said seventh coupling means including means responsive to the sign indication for selectively enabling said increment and decrement inputs to said second up/down counter;

S. ninth coupling means coupling the correction factor word issued from said memory to said rate control input terminals of said second synchronous binary rate multiplier; and T. tenth coupling means for coupling the output signals from said second up/down to said address inputs of said memory;

whereby the binary representation of the second order of the correction factor controls the fractional multiplication which said second binary rate multiplier applies to the timing pulses from said second source, and the resultant pulses are applied to said increment or decrement inputs to said first up/down counter to alter the count therein, thereby correspondingly altering the rate multiplication applied to the precision timing pulses from said first source by said first binary rate multiplier, the linearized pulses issuing from said signal output terminal from said first binary rate multiplier being coupled to said increment input to said digital counter-display unit, and whereby periodic comparisons are made to representations of boundary information stored in said memory and the count held in said repeater counter to determine whether the count in said second up/down counter should be incremented or decremented to correspondingly alter the binary representation applied to the rate control inputs to said second synchronous binary rate multiplier from said memory.

11. The linearizer of claim 10 which further includes:

A. a third scource of timing pulses, the pulses from said third source having a frequency intermediate the frequencies of the pulses from said first source and the pulses from said second source;

B. a flip-flop device responsive to a predetermined pattern of the output signals from said second up/down counter, said flip-flop device changing state when said second up/down counter reaches a count at which the predetermined pattern is issued thereby; and C. gate means responsive to a change of state by said flip-flop device to apply pulses from said third source to said signal input terminal of said second binary rate multiplier.

12. A temperature measuring system comprising:

A. a thermocouple for generating a voltage in accordance with its junction temperature;

B. a double-slope analog measuring subsystem adapted to receive the voltage generated by said thermocouple for conversion thereof to a constant slope representation during an integrate reference time period;

C. a source of precision timing pulses;

D. a second-order linearizer for converting the precision timing pulses to linearized clock pulses, said second order linearizer comprising:

1. a first synchronous binary rate multiplier for receiving the precision timing pulses and issuing the linearized clock pulses, said first synchronous binary rate multiplier including a plurality of rate inputs;

2. a first counter, said first counter having an increment input terminal and a plurality of output terminals which issue output signals representative of the instantaneous count held therein;

3. means coupling said output terminals to said rate inputs whereby the instantaneous count held in said first counter governs the rate factor applied to the precision timing pulses by said first synchronous binary rate multiplier to obtain the linearized clock pulses;

4. second-order means for changing the count in said first counter in accordance with a function of the characteristic curve of said thermocouple, said second order means including:

a. a source of secondary timing pulses having a frequency lower than the precision timing pulses;

b. a second synchronous binary rate multiplier for receiving the secondary timing pulses and issuing an output at a fractional multiple thereof, said second synchronous binary rate multiplier including a plurality of rate inputs;

c. rate control means for generating rate control signals in accordance with a function of the characteristic curve of said thermocouple; and d. means coupling said rate control signals to said rate inputs of said second synchronous binary rate multiplier.

13. A temperature measuring system comprising:

A. a thermocouple for generating a voltage in accordance with its junction temperature;

B. a double-slope analog measuring subsystem adapted to receive the voltage generated by said thermocouple for conversion thereof to a constant slope representation during an integrate reference time period;

C. a first source of precision timing pulses;

D. a second-order linearizer for converting the precision timing pulses to linearized clock pulses, said second-order linearizing including:

1. a first synchronous binary rate multiplier, said first binary rate multiplier having a signal input terminal connected to receive pulses from said first source, a signal output terminal, and a plurality of rate control input terminals;

2. a second synchronous binary rate multiplier, said second binary rate multiplier having a signal input terminal, a signal output terminal, and a plurality of rate control input terminals;

3. a second source of timing pulses, the pulses from said second source occurring at a lower frequency than the pulses from said first source;

4. a first up/down counter, said first up/down counter having an increment input terminal, a decrement input terminal, and a plurality of output terminals which issue output signals representative of the instantaneous count held therein;
5. a memory for storing a plurality of addressable words in each of first and second word groups, each word in said first group being a binary representation of the second order of a correction factor for a predetermined segment of the characteristic curve of the thermocouple; each word in said second group being a binary representation of curve segment boundary information, said memory including a plurality of address inputs;
6. a second up/down counter, said second up/down counter having an increment input terminal, a decrement input terminal, and a plurality of output terminals which issue output signals representative of the instantaneous count held therein;
7. a multiple stage decimal counter/display unit having an increment input;
8. a comparator, said comparator having first and second series of binary inputs and an output terminal which issues a compare signal only when the signals applied to said first and second series of binary inputs are identical, digit by digit;
9. a multiple stage decimal repeater counter adapted to repeat the count instantaneously contained within at least two stages of said multiple stage decimal counter/display unit;
10. first coupling means for coupling said signal output terminal of said first synchronous binary rate multiplier to said increment input of said digital counter/display unit;
11. second coupling means for coupling said output terminals of said first up/down counter to said rate control input terminals of said first synchronous binary rate multiplier;
12. third coupling means for selectively coupling said signal output terminal of said second synchronous binary rate multiplier to said increment and decrement inputs of said first up/down counter, said third coupling means being responsive to a predetermined one of a sign component of the correction factor binary representation and a sign indication of the quantity being linearized during the integrate reference time period for selectively steering the pulses from said signal output terminal of said second binary rate multiplier to one of said increment and decrement inputs of said first up/down counter;
13. fourth coupling means for coupling the pulses from said second source to said input terminal of said second synchronous binary rate multiplier;
14. fifth coupling means for coupling the correction factor word issued by said memory to said rate control input terminals of said second synchronous binary rate multiplier;
15. sixth coupling means for coupling the instantaneous count held in said repeater counter to said first series of binary inputs to said comparator;
16. seventh coupling means for coupling the boundary information words from said memory to said second series of binary inputs to said comparator;
17. eighth coupling means for coupling the output signals from said second up/down counter to said address inputs of said memory; and
18. ninth coupling means for coupling said compare output from said comparator to said second up/down counter, said ninth coupling means including means responsive to the sign indication for selectively enabling said increment and decrement inputs to said second up/down counter.

* * * * *